(12) United States Patent
Fan et al.

(10) Patent No.: US 6,790,730 B2
(45) Date of Patent: Sep. 14, 2004

(54) FABRICATION METHOD FOR MASK READ ONLY MEMORY DEVICE

(75) Inventors: Tso-Hung Fan, Taipei Hsien (TW); Yen-Hung Yeh, Taoyuan Hsien (TW); Kwang-Yang Chan, Hsinchu (TW); Mu-Yi Liu, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 76 days.

(21) Appl. No.: 10/156,325

(22) Filed: May 24, 2002

(65) Prior Publication Data

US 2003/0219930 A1 Nov. 27, 2003

(30) Foreign Application Priority Data

May 21, 2002 (TW) ...................................... 91110594 A

(51) Int. Cl.[7] ............................................ H01L 21/336
(52) U.S. Cl. ........................ 438/267; 438/142; 438/257; 438/594
(58) Field of Search .......................... 438/142, 257–267, 438/286, 593–4

(56) References Cited

U.S. PATENT DOCUMENTS

| | | | | |
|---|---|---|---|---|
| 5,780,339 A | * | 7/1998 | Liu et al. | 438/253 |
| 6,242,307 B1 | * | 6/2001 | Sheu | 438/264 |
| 6,607,957 B1 | * | 8/2003 | Fan et al. | 438/276 |

* cited by examiner

Primary Examiner—Kamand Cuneo
Assistant Examiner—Lisa Kilday
(74) Attorney, Agent, or Firm—J.C. Patents

(57) ABSTRACT

A fabrication method for a mask read only memory device is described. The method provides a substrate, and a doped conductive layer is formed on the substrate. After this, the doped conductive layer is patterned to form a plurality of bar-shaped doped conductive layers, followed by forming a dielectric layer on the substrate and on the bar-shaped conductive layers by thermal oxidation. A plurality of diffusion regions are concurrently formed under the bar-shaped conductive layers in the substrate. A patterned conductive layer is further formed on the dielectric layer.

13 Claims, 3 Drawing Sheets

FABRICATION METHOD FOR MASK READ ONLY MEMORY DEVICE

CROSS-REFERENCE TO RELATED APPLICATION

This application claims the priority benefit of Taiwan application serial no. 91110594, filed May 21, 2002.

BACKGROUND OF THE INVENTION

1. Field of the Invention

The present invention relates to a fabrication method for a read only memory device. More particularly, the present invention relates to a fabrication method for a mask read only memory (ROM) device.

2. Description of Related Art

The read only memory device provides the non-volatile property, wherein the stored information is retained even power is interrupted. As a result, the read only memory device is incorporated into many electronic products to maintain a normal operation for the products. The mask read only memory device is the most fundamental type of read only memory device. A typical mask ROM device uses a channel transistor as the memory device. The programming of a mask ROM device is accomplished by selectively implanting ions to an identified channel region. By altering the threshold voltage, the control of the "on" and the "off" of the memory device is thus achieved.

A typical mask read only memory device comprises a polysilicon word line, that crosses over the bit line. The region under the word line and between the bit lines is the channel region of the memory device. Whether ions are implanted to the channel region determines the storage of the binary digit of either "0" or "1", wherein the implanting of ions to the identified channel region is known as coding implantation.

Under the current development of increasing the device integration, devices are being scaled down according to the design rule. In order to prevent the short channel effect resulted from the reduction of the device dimension, a shallow junction or an ultra shallow junction is used for the buried bit line, which is formed by pocket ion implantation. A shallow junction or an ultra shallow junction can improve the short channel effect resulted from the reduction of the device dimension. However, the depth of the junction of the buried bit line becomes shallower, the resistance of the buried bit line thereby increases.

SUMMARY OF THE INVENTION

Accordingly, the present invention provides a fabrication method for a mask ROM device, wherein the short channel effect resulted from the reduction of the device dimension is prevented.

The present invention provides a fabrication method for a mask ROM device, wherein an increase of the resistance due to a shallow source/drain junction is also prevented.

The fabrication method for a mask ROM device according to the present invention includes providing a substrate, wherein a doped conductive layer is formed on the substrate. The doped conductive layer is then patterned to form a plurality of bar shaped doped conductive layers. Thermal oxidation is further performed to form a dielectric layer on the substrate and on the bar shaped doped conductive layers. A plurality of diffusion regions are concurrently formed in the substrate under the bar-shaped conductive layers. Thereafter, a patterned conductive layer is formed on the dielectric layer.

As disclosed in the above, the source/drain regions of the present invention are the diffusion regions formed by the diffusion of dopants from the bar-shaped doped conductive layers. The junction of the source/drain region is thereby shallower to prevent the short channel effect generated from the reduction of the device dimension.

Further, the bit line of the present invention includes the raised bit line formed by the doped conductive layer on the substrate. The thickness of the bit lines is thus sufficient to prevent an increase of the resistance resulted from a shallower junction.

Additionally, the gate dielectric layer (which is the part of the dielectric layer that forms on the substrate surface) and the insulation layer on the bar-shaped doped conductive layers are formed in a same processing step. An extra processing step for forming the insulation layer on the bar shaped conductive layers is thus obviated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention provides a fabrication method for a mask read only memory. FIGS. 1A–1D are schematic, cross-sectional views illustrating the process flow of a manufacturing method for a mask ROM device according to one preferred embodiment of the present invention.

Figure 1A:
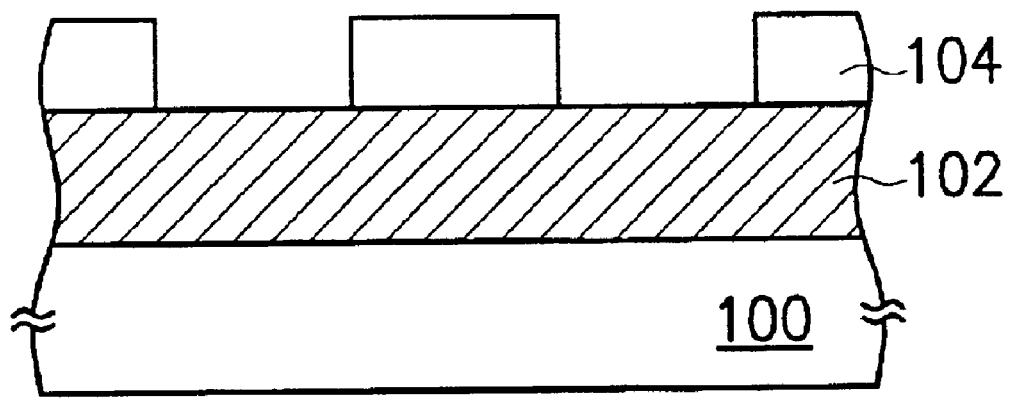
FIGS. 1A–1D are schematic, cross-sectional views illustrating the process flow of a manufacturing method for a mask ROM device according to one preferred embodiment of the present invention.

Referring to FIG. 1A, a substrate 100 is provided. This substrate 100 is, for example, a semiconductor silicon substrate. A doped conductive layer 102 is then formed on the substrate 100. The doped conductive layer 102 is, for example, a polysilicon layer doped with ions. Forming the doped conductive layer 102 includes, an in-situ ion doping process by chemical vapor deposition to form a layer of doped polysilicon on the substrate 100. The ions used in the doping process includes phosphorous, and the dopant concentration is about $0.5 \times 10^{19}/cm^3$ to about $0.5 \times 10^{21}/cm^3$. The ions used in the doping process can be arsenic at a concentration of about $0.5 \times 10^{19}/cm^3$ to about $0.5 \times 10^{21}/cm^3$. A patterned mask layer 104 is further formed on the doped conductive layer 102.

Figure 1B:
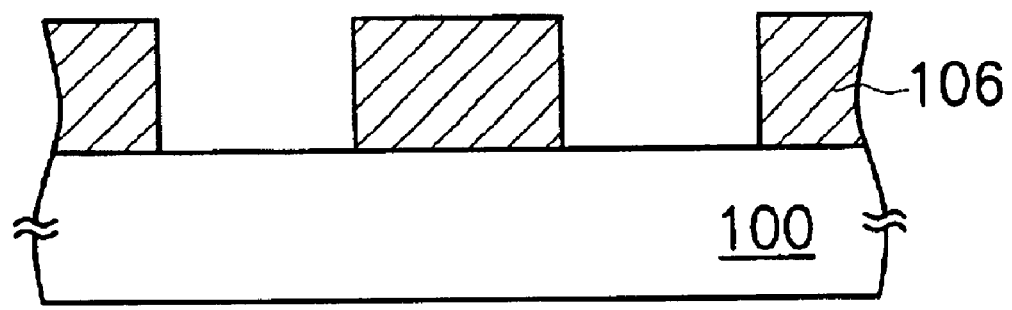

Referring to FIG. 1B, a portion of the doped conductive layer 102 is removed until the surface of the substrate 100 is exposed to form a plurality of parallel bar-shaped doped conductive layers 106, using the mask layer 104 as a mask. The mask layer 104 is then removed. Removing the doped conductive layer 102 includes performing anisotropic etching.

Figure 1C:
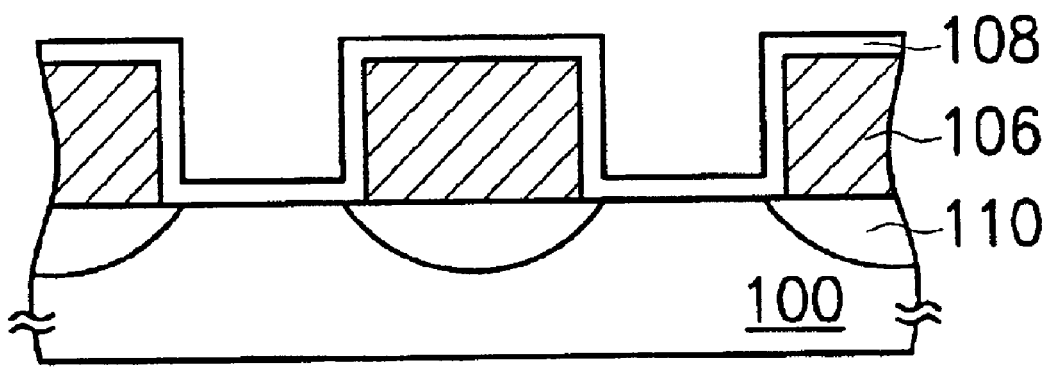

Continuing to FIG. 1C, a thermal oxidation process is performed to form a dielectric layer 108 on the substrate 100 and on the bar shaped doped conductive layers 106. Also, during the thermal oxidation process, the dopants in the bar-shaped doped conductive layers 106 are diffused to the substrate 100 to form a shallow junction diffusion region 110. A part of the dielectric layer 108 on the substrate 100 surface serves as the gate dielectric layer, while other part of the dielectric layer 108 that is on the surface of the bar-shaped doped conductive layers 106 is used as an insulation layer to isolate the conductive layer subsequently. The shallow junction diffusion region 110 is served as the source/drain region of the mask read only memory device, whereas the bar-shaped conductive layers above the source/drain region is used as a raised bit line.

Since the source/drain region of the mask ROM device is a shallow junction diffusion region 110, the short channel effect resulted from a reduction of the device dimension is prevented even pocket ion implantation is not performed. Further, the bar-shaped doped conductive layers 106 that are disposed on the substrate 100 as the raised bit lines. The thickness of the bit line is thus sufficient to prevent an increase of the resistance due to a shallow junction of the source/drain region.

Figure 1D:
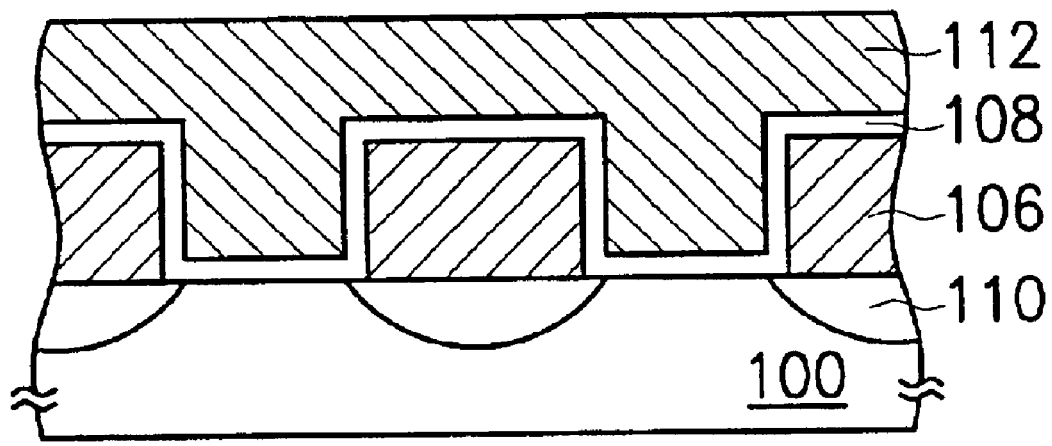

Continuing to FIG. 1D, a patterned conductive layer 112 is formed on the dielectric layer 108 as the word line, wherein the conductive layer 112 is, for example, a polysilicon or a polycide layer. Forming the patterned conductive layer 112 includes forming a conductive material layer (not shown) on the substrate 100, followed by photolithographing and etching the patterned conductive material layer to form the conductive layer 112.

According to the mask ROM device formed by the present invention, the source/drain region (diffusion region) is formed with a shallower junction. A pocket ion implantation is not required for preventing the occurrence of the short channel effect. However, a pocket ion implantation can also performed after the formation of the diffusion region 110 to enhance the suppression of the short channel effect. Such an approach is illustrated from FIGS. 2A to 2C.

Figure 2A:
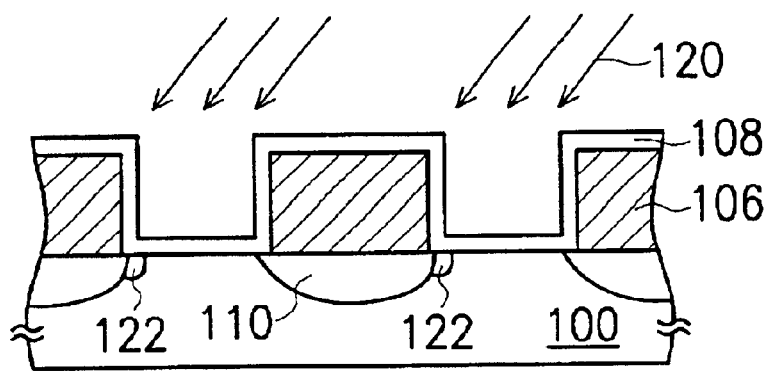
FIGS. 2A–2C are schematic, cross-sectional views illustrating the pocket implantation process for a mask ROM device according to the preferred embodiment of the present invention.

FIG. 2A is processing step that proceed the step illustrated in FIG. 1C. As shown to FIG. 2A, a tilt angle ion implantation process 120 is performed on one side of the bar-shaped doped conductive layers 106 to form a pocket ion implantation region 122 on the one side of the diffusion region 110. The type of dopants used for the tilt angle ion implantation process 120 is same as the type used in the forming the diffusion region 110, whereas the dopant concentration for the tilt angle ion implantation process 120 is lower than that in the diffusion region 110.

Figure 2B:
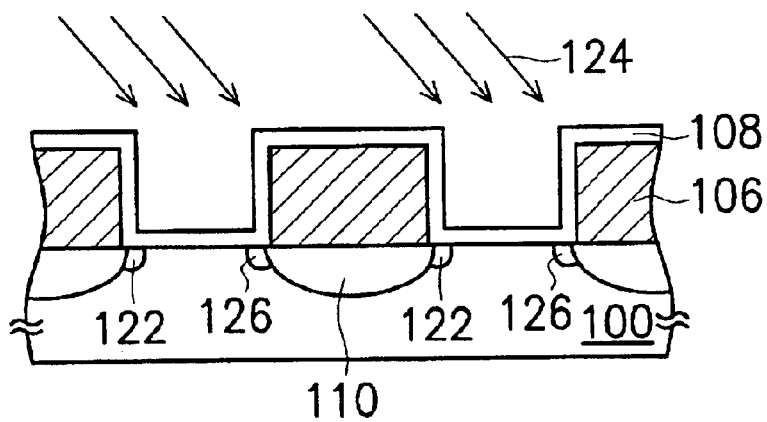

Continuing to FIG. 2B, another tilt angle ion implantation process 124 is performed on the other side of the bar-shaped conductive layer 106 to form a pocket ion implantation region 126 on the other side of the diffusion region 110. The type of dopants used for the tilt angle ion implantation process 124 is same as the type used in the forming the diffusion region 110, whereas the dopant concentration for the tilt angle ion implantation process 124 is lower than that in the diffusion region 110.

Figure 2C:
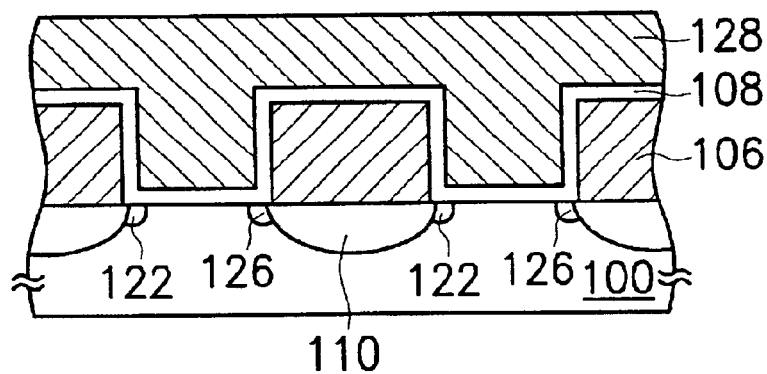

Referring to FIG. 2C, a patterned conductive layer 128 is formed on the dielectric layer 108 as the word line, wherein the conductive layer 128 includes polysilicon or polycide. Forming the patterned conductive layer 128 includes forming a conductive material layer on the substrate 100, followed by photolithographing and etching the conductive material layer to form the conductive layer 128.

According to the above preferred embodiment, the dielectric layer 108 is a silicon oxide layer formed by thermal oxidation. The dielectric layer 108, however, is not limited to an oxide formed by thermal oxidation. The dielectric layer 108 includes silicon oxide, silicon oxynitride, silicon nitride, silicon oxide-silicon nitride-silicon oxide stacked layer, silicon nitride-silicon nitride-silicon nitride stacked layer, silicon nitride-silicon nitride-silicon oxide stacked layer, silicon oxide-silicon oxide-silicon nitride stacked layer that formed by chemical vapor deposition process. The diffusion of dopants from the bar shaped conductive layers 106, which was triggered by the thermal process, can then be accomplished by the annealing process in densifying the dielectric layer structure.

Based on the foregoing, the source/drain region is the diffusion region in the substrate and is formed with dopants diffused from the bar shaped conductive layers. The source/drain region is thus formed with a shallower junction to prevent the short channel effect due to a reduction of the device dimension.

Moreover, the bit line of the present invention includes the raised bit line formed by the bar shaped conductive layer that is disposed on the substrate. The bit line thus has a thickness that is sufficient to prevent an increase of the resistance due to a shallower junction of the source/drain region.

Additionally, the gate dielectric layer and the insulation layer above the bar-shaped doped conductive layers are formed in a same processing step. The step in forming the insulation layer on the bar-shaped conductive layers can be omitted Moreover, the pocket ion implantation region can be formed on both sides of the source/drain region (diffusion region) to further suppress the short channel effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a mask ROM device, the method comprising:
   providing a substrate;
   forming a doped conductive layer on the substrate;
   patterning the doped conductive layer to form a plurality of bar-shaped conductive layers;
   forming a dielectric layer on the substrate and on the bar-shaped conductive layers by thermal oxidation and a plurality of diffusion regions directly under the bar-shaped conducive layers in the substrate; and
   forming a patterned conductive layer on the dielectric layer.

2. The method of claim 1, wherein the doped conductive layer includes a doped polysilicon layer.

3. The method of claim 1, wherein forming the doped conductive layer includes performing a chemical vapor deposition process and doping ions in-situ.

4. The method of claim 2, wherein the ions include phosphorous.

5. The method of claim 4, wherein an ion concentration is about $0.5 \times 10^{19}$ to about $0.5 \times 10^{21}/cm^3$.

6. The method of claim 1, wherein after forming the diffusion regions, further comprising a pocket ion implantation process to form a doped region beside the diffusion regions.

7. A fabrication method for a mask read only memory device, comprising:

provide a substrate;

forming a doped conductive layer on the substrate;

patterning the doped conductive layer to form a plurality of bar-shaped doped conductive layers;

forming a dielectric layer on the substrate directly on the bar-shaped doped conductive layers;

performing an annealing process to form a plurality of diffusion regions in the substrate under the bar-shaped conductive layers; and forming a patterned conductive layer on the dielectric layer.

8. The method of claim 7, wherein the doped conductive layer includes a doped polysilicon layer.

9. The method of claim 7, wherein forming the doped conductive layer includes performing chemical vapor deposition and doping ions in-situ.

10. The method of claim 9, wherein the ions include phosphorous.

11. The method of claim 10, wherein a concentration for the ions is about $0.5 \times 10^{19}$ to about $0.5 \times 10^{21}/cm^3$.

12. A fabrication method for a mask ROM device, the method comprising:

forming a plurality of bar-shaped doped conductive layers on a substrate;

forming concurrently a dielectric layer on the conductive layers and a shallow doped region directly underneath the bar-shaped doped conductive layers; and forming a patterned conductive layer on the dielectric layer.

13. A fabrication method for a mask ROM device, the method comprising:

forming a plurality of bar-shaped doped conductive layers on a substrate;

performing a thermal oxidation process to form a dielectric layer on the conductive layers and to drive a dopant the conductive layers into the substrate; and forming a patterned conductive layer on the dielectric layer.

* * * * *